United States Patent
Lee et al.

(10) Patent No.: US 9,955,580 B2
(45) Date of Patent: Apr. 24, 2018

(54) METHOD OF MANUFACTURING RIGID-FLEXIBLE PRINTED CIRCUIT BOARD

(71) Applicant: SAMSUNG ELECTRO-MECHANICS CO., LTD., Suwon-si (KR)

(72) Inventors: Yang Je Lee, Cheongju-si (KR); Jae Ho Shin, Daejeon (KR); Dek Gin Yang, Cheongju-si (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 0 days.

(21) Appl. No.: 15/228,304

(22) Filed: Aug. 4, 2016

(65) Prior Publication Data

US 2016/0345431 A1 Nov. 24, 2016

Related U.S. Application Data

(63) Continuation of application No. 14/513,421, filed on Oct. 14, 2014, now abandoned, which is a
(Continued)

(30) Foreign Application Priority Data

Feb. 24, 2012 (KR) .................... 10-2012-0019149

(51) Int. Cl.
*H05K 1/11* (2006.01)
*H05K 3/00* (2006.01)
(Continued)

(52) U.S. Cl.
CPC ........... *H05K 1/118* (2013.01); *H05K 1/0278* (2013.01); *H05K 1/0298* (2013.01);
(Continued)

(58) Field of Classification Search
CPC ........................... H05K 1/0393; H05K 1/118
See application file for complete search history.

(56) References Cited

U.S. PATENT DOCUMENTS 4,931,134 A 6/1990 Hatkevitz et al.
7,281,328 B2 10/2007 Lee et al.
(Continued)

FOREIGN PATENT DOCUMENTS

CN 1728923 A 2/2006
CN 1947475 A 4/2007
(Continued)

OTHER PUBLICATIONS

Office Action mailed from the United States Patent and Trademark Office dated Dec. 26, 2013 in the related U.S. Appl. No. 13/771,834.
(Continued)

*Primary Examiner* — Jeremy C Norris
(74) *Attorney, Agent, or Firm* — NSIP Law (57) ABSTRACT

A method of manufacturing a rigid-flexible printed circuit board, which including: providing a first flexible film having a first metal layer on one or both surfaces; forming a circuit pattern by patterning the first metal layer; forming a second flexible film, which has a second metal layer on one surface, on one or both surfaces of the first flexible film; forming a circuit pattern by patterning the second metal layer in a rigid domain R; providing an anti-oxidation protective layer on the second metal layer in a flexible domain F; laminating at least one circuit layer on the second flexible film; and removing the circuit layer in the flexible domain F.

13 Claims, 8 Drawing Sheets

Related U.S. Application Data continuation of application No. 13/771,834, filed on Feb. 20, 2013, now Pat. No. 8,882,954.

(51) Int. Cl.
| | | |
|---|---|---|
| *H05K 3/46* | (2006.01) | |
| *H05K 3/02* | (2006.01) | |
| *H05K 1/02* | (2006.01) | |
| *H05K 3/28* | (2006.01) | |

(52) U.S. Cl.
CPC ......... *H05K 3/0026* (2013.01); *H05K 3/0058* (2013.01); *H05K 3/02* (2013.01); *H05K 3/027* (2013.01); *H05K 3/285* (2013.01); *H05K 3/4644* (2013.01); *H05K 3/4691* (2013.01); *H05K 2201/0154* (2013.01); *Y10T 156/10* (2015.01); *Y10T 156/1064* (2015.01); *Y10T 156/1082* (2015.01)

(56) References Cited

U.S. PATENT DOCUMENTS

| | | | |
|---|---|---|---|
| 8,882,954 | B2 | 11/2014 | Lee et al. |
| 2006/0019075 | A1 | 1/2006 | Myoung et al. |
| 2006/0213683 | A1 | 9/2006 | Myoung et al. |
| 2007/0059918 | A1 | 3/2007 | Jung et al. |
| 2008/0099230 | A1 † | 5/2008 | Takahashi |
| 2008/0124522 | A1 | 5/2008 | Chuman et al. |
| 2009/0014205 | A1 | 1/2009 | Kobayashi et al. |
| 2009/0114428 | A1 | 5/2009 | Ueno |
| 2011/0094776 | A1 | 4/2011 | Lee et al. |
| 2011/0194262 | A1 | 8/2011 | Naganuma et al. |
| 2014/0008107 | A1* | 1/2014 | Lee .................. H05K 1/0218 174/254 |

FOREIGN PATENT DOCUMENTS

| | | |
|---|---|---|
| CN | 101431857 A | 5/2009 |
| CN | 102149251 A | 8/2011 |
| JP | 2006-173187 A † | 6/2006 |
| KR | 10-1009072 B1 | 1/2011 |

OTHER PUBLICATIONS

Office Action mailed from the United States Patent and Trademark Office dated Apr. 15, 2014 in the related U.S. Appl. No. 13/771,834.
Notice of Allowance mailed from the United States Patent and Trademark Office dated Jul. 9, 2014 in the related U.S. Appl. No. 13/771,834.
Chinese Notification of the First Office Action, issued in corresponding Chinese Patent Application No. 2013100575752, dated May 7, 2015; 14 pages with English Translation.
Chinese Office Action dated Jan. 26, 2018, in corresponding Chinese Application No. 201610095254.5 (9 pages in English, 7 pages in Chinese).
U.S. Appl. No. 13/771,834, filed Feb. 20, 2013, Lee et al.

\* cited by examiner
† cited by third party

METHOD OF MANUFACTURING RIGID-FLEXIBLE PRINTED CIRCUIT BOARD

CROSS-REFERENCE TO RELATED APPLICATIONS

This application is a U.S. continuation application filed under 37 CFR 1.53(b) claiming priority benefit of U.S. Ser. No. 14/513,421 filed in the United States on Oct. 14, 2014, which is a U.S. continuation application filed under 37 CFR 1.53(b) claiming priority benefit of U.S. Ser. No. 13/771,834 filed in the United States on Feb. 20, 2013, now allowed, which claims earlier foreign priority benefit under 35 U.S.C. Section 119 of Korean Patent Application Serial No. 10-2012-0019149, entitled "Method of Manufacturing Rigid Flexible Printed Circuit Board" and filed in the Korean Intellectual Property Office on Feb. 24, 2012, the contents of which are hereby incorporated by reference in their entirety into this application.

BACKGROUND

1. Field

The present invention relates to a method of manufacturing a rigid-flexible printed circuit board, and more particularly, to a method of manufacturing a rigid-flexible printed circuit board including a process of providing an anti-oxidation protective layer.

2. Description of the Related Art

In recent times, as the degree of integration of semiconductor elements is gradually increasing, the number of pads provided on the semiconductor elements to connect the semiconductor elements to external circuits is increasing and mounting density is also on an increasing trend. For example, when a minimum processing dimension of the semiconductor element made of silicon is about 0.2 μm, it is required to provide about 1000 pads on the semiconductor element with a size of about 10 mm.

Further, in semiconductor devices such as semiconductor packages, on which the semiconductor elements are mounted, miniaturization and thinning are needed to improve the mounting density, and particularly, in order to respond to portable information devices such as notebook personal computers (PCs), PDAs, and mobile phones, miniaturization and thinning of the semiconductor packages are needed.

In order to package the semiconductor element, it is required to connect the pad of the semiconductor element to a pad of a wiring substrate as well as mounting the semiconductor element on the wiring substrate. However, when about 1000 pads are provided around the semiconductor element with a size of about 10 mm, they are provided with a very fine pitch of about 40 μm. In order to connect the pads provided with a fine pitch to the pad provided on the wiring substrate, since very high accuracy is required for wiring on the wiring substrate or positioning upon connection, it is very difficult to apply a conventional wire bonding or tape automated bonding (TAB) technique.

Accordingly, recently, various multilayer printed circuit boards, which can mount electronic components on surfaces thereof, have been developed according to miniaturization and integration of the electronic components, and particularly, active researches on a flying tail type rigid-flexible printed circuit board, which can minimize a space occupied by a printed circuit board and be three-dimensionally and spatially transformed, are in progress.

This flying tail type rigid-flexible printed circuit board, which consists of a rigid domain (hereinafter, R) having mechanical strength due to an embedded insulating layer and a flexible domain (hereinafter, F) that connects the rigid domains R to each other and has elasticity, is mainly used in small terminals, such as mobile phones, requiring high integration by removing an unnecessary space due to use of a connector in response to demands for high integration and fine pitches of mounted components according to high functionality of mobile devices.

Korean Patent Laid-open Publication No. 10-2010-0081139 (hereinafter, related art document) discloses the invention on a method of manufacturing a rigid-flexible printed circuit board that is capable of minimizing desmear attack occurring when processing a window.

However, when looking into the claim of the related art document, like a conventional typical process of manufacturing a printed circuit board, a rigid-flexible printed circuit board is finally completed through the steps of providing a base substrate divided into a rigid domain R and a flexible domain F, laminating a plurality of circuit layers on the base substrate, and removing the circuit layer in the flexible domain F. In this case, the base substrate may be also damaged by laser light when removing the circuit layer in the flexible domain F. Generally, when laminating a plurality of circuit layers, oxidation (for example, brown or black oxidation) is performed on a surface of the circuit layer, that is, a surface of a metal layer on which a circuit pattern is formed, for improvement of adhesion between the circuit layers. At this time, the metal layer is disclosed by an oxidation solution, and the discolored metal layer absorbs the laser light used for removing the circuit layer in the flexible domain F. In other words, the oxidized metal layer has improved adhesive strength but can't perform a function as a stopper during a laser process due to the discoloration caused by the oxidation. Finally, the laser light is irradiated to the base substrate (flexible film) in the process of removing the circuit layer in the flexible domain F, thus causing damage to the base substrate.

Like this, according to the conventional method of manufacturing a rigid-flexible printed circuit board, the base substrate in the flexible domain F may be damaged, thus eventually causing product defects.

RELATED ART DOCUMENT

Patent Document

Patent Document 1: Korean Patent Laid-open Publication No. 10-2010-0081139

SUMMARY

The present invention has been invented in order to overcome the above-described problems and it is, therefore, an object of the present invention to provide a method of manufacturing a rigid-flexible printed circuit board that is capable of protecting a flexible film when removing a circuit layer in a flexible domain F.

In accordance with one aspect of the present invention to achieve the object, there is provided a method of manufacturing a rigid-flexible printed circuit board including the steps of: providing a first flexible film having a first metal layer on one or both surfaces; forming a circuit pattern by patterning the first metal layer; forming a second flexible film, which has a second metal layer on one surface, on one or both surfaces of the first flexible film; forming a circuit pattern by patterning the second metal layer in a rigid domain R; providing an anti-oxidation protective layer on the second metal layer in a flexible domain F; laminating at least one circuit layer on the second flexible film; and removing the circuit layer in the flexible domain F.

At this time, the anti-oxidation protective layer is removed in the step of removing the circuit layer in the flexible domain F.

And, the second metal layer corresponding to the flexible domain F is removed in the step of removing the circuit layer in the flexible domain F.

Further, the method of manufacturing a rigid-flexible printed circuit board further includes the step of attaching a bonding sheet between the second metal layer and the anti-oxidation protective layer.

Further, the anti-oxidation protective layer is made of an adhesive material including polyimide.

Further, the step of providing the anti-oxidation protective layer on the second metal layer in the flexible domain F is performed through the steps of applying slurry, which is made of an adhesive material including polyimide, on the second metal layer corresponding to the flexible domain F; and curing the slurry.

Further, the method of manufacturing a rigid-flexible printed circuit board further includes the step of providing a bonding sheet between the first flexible film and the second flexible film.

Further, the step of laminating the at least one circuit layer on the second flexible film laminates the circuit layer after oxidizing the circuit pattern under the circuit layer.

Further, the circuit layer is formed through the steps of forming an insulating layer which covers the circuit pattern under the circuit layer; forming a metal layer on the insulating layer; and forming a circuit pattern by patterning the metal layer.

Further, in the step of forming the circuit pattern by patterning the metal layer, the metal layer in the flexible domain F is removed.

Further, the step of removing the circuit layer in the flexible domain F is performed by a CO2 laser drilling process or a YAG laser drilling process.

Further, before the laser drilling process, a flexible domain F portion of the metal layer included in the uppermost circuit layer is removed.

In accordance with another aspect of the present invention to achieve the object, there is provided a method of manufacturing a rigid-flexible printed circuit board including the steps of: providing a flexible film having a metal layer on one or both surfaces; forming a circuit pattern by patterning the metal layer; forming a stopper metal layer on the metal layer in a flexible domain F; providing an anti-oxidation protective layer on the stopper metal layer; laminating at least one circuit layer on the flexible film; and removing the circuit layer in the flexible domain F.

At this time, the method of manufacturing a rigid-flexible printed circuit board further includes the step of attaching a release film between the metal layer and the stopper metal layer.

And, the anti-oxidation protective layer is removed in the step of removing the circuit layer in the flexible domain F.

Further, the stopper metal layer is removed in the step of removing the circuit layer in the flexible domain F.

Further, the method of manufacturing a rigid-flexible printed circuit board further includes the step of attaching a bonding sheet between the stopper metal layer and the anti-oxidation protective layer.

Further, the anti-oxidation protective layer is made of an adhesive material including polyimide.

Further, the step of providing the anti-oxidation protective layer on the stopper metal layer is performed through the steps of applying slurry, which is made of an adhesive material including polyimide, on the stopper metal layer; and curing the slurry.

Further, the step of laminating the at least one circuit layer on the flexible film laminates the circuit layer after oxidizing the circuit pattern under the circuit layer.

Further, the circuit layer is formed through the steps of forming an insulating layer which covers the circuit pattern under the circuit layer; forming a metal layer on the insulating layer; and forming a circuit pattern by patterning the metal layer.

Further, in the step of forming the circuit pattern by patterning the metal layer, the metal layer in the flexible domain F is removed.

Further, the step of removing the circuit layer in the flexible domain F is performed by a CO2 laser drilling process or a YAG laser drilling process.

Further, before the laser drilling process, a flexible domain F portion of the metal layer included in the uppermost circuit layer is removed.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DESCRIPTION OF EMBODIMENTS

Advantages and features of the present invention and methods of accomplishing the same will be apparent by referring to embodiments described below in detail in connection with the accompanying drawings. However, the present invention is not limited to the embodiments disclosed below and may be implemented in various different forms. The exemplary embodiments are provided only for completing the disclosure of the present invention and for fully representing the scope of the present invention to those skilled in the art. Like reference numerals refer to like elements throughout the specification.

Terms used herein are provided to explain embodiments, not limiting the present invention. Throughout this specification, the singular form includes the plural form unless the context clearly indicates otherwise. When terms "comprises" and/or "comprising" used herein do not preclude existence and addition of another component, step, operation and/or device, in addition to the above-mentioned component, step, operation and/or device.

Hereinafter, configuration and operational effect of the present invention will be described in detail with reference to the accompanying drawings.

FIGS. 1 through 15 are process diagrams showing a method of manufacturing a rigid-flexible printed circuit board in accordance with the present invention.

Figure 1:
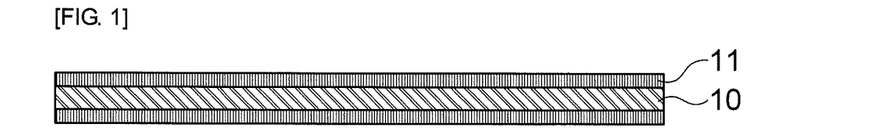
FIGS. 1 through 15 are process diagrams showing a method of manufacturing a rigid-flexible printed circuit board in accordance with the present invention.

First, as shown in FIG. 1, a method of manufacturing a rigid-flexible printed circuit board in accordance with the present invention performs the step of providing a first flexible film 10 having a first metal layer 11 on one or both surfaces.

Here, the first flexible film 10 is a film made of a soft and flexible material and mainly made of a polyimide material.

The first metal layer 11 is formed by one or a combination of electroless plating, electroplating, screen printing, sputtering, evaporation, ink-jetting, and dispensing using one of Cu, Ag, Sn, Au, Ni, and Pd.

Figure 2:
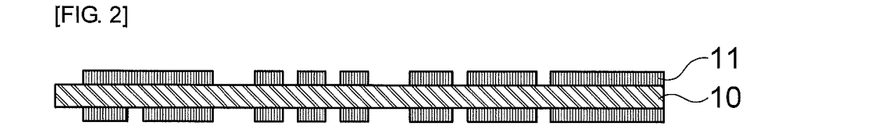

Next, as shown in FIG. 2, the step of forming a circuit pattern by patterning the first metal layer 11 is performed.

The circuit pattern may be formed by one of photolithography, E-beam lithography, focused ion beam lithography, dry etching, wet etching, and nano-imprinting through processes such as exposure, developing, and etching after attaching a photosensitive film with a predetermined pattern on the metal layer.

Figure 3:
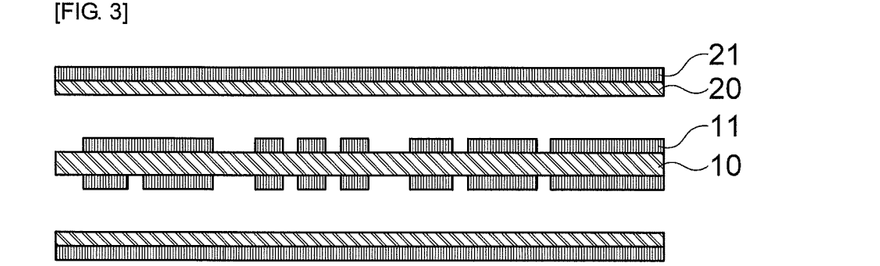

Next, the step of forming a second flexible film 20, which has a second metal layer 21 on one surface, on one or both surfaces of the first flexible film 10 is performed. Since a method of forming the second metal layer 21 is the same as a method of forming the first metal layer 11, detailed description will be omitted.

When forming the second flexible film 20 on the first flexible film 10, as shown in FIG. 3, one surface of the second flexible film 20, where the second metal layer 21 is not formed, is bonded to the first flexible film 10.

Figure 4:
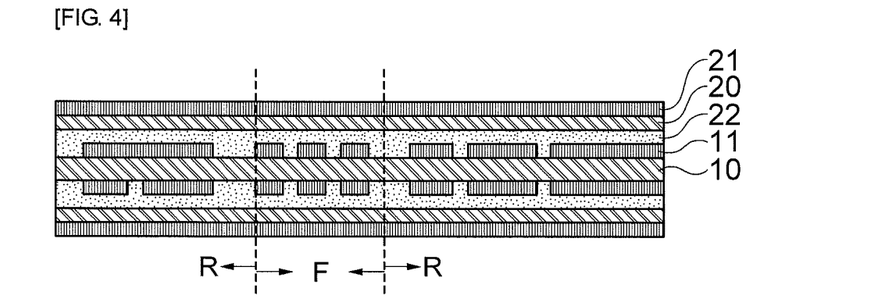

At this time, as shown in FIG. 4, the step of providing a bonding sheet 22 between the first flexible film 10 and the second flexible film 20 may be additionally performed. The bonding sheet 22 may be made of an epoxy thermosetting resin or a prepreg material.

Accordingly, the second flexible film 20 can be formed on the first flexible film 10 by temporarily attaching the bonding sheet 22 to one surface of the second flexible film 20, where the second metal layer 21 is not formed, and being pressed with a press in a state of being laminated on the first flexible film 10.

Next, the step of forming a circuit pattern by patterning the second metal layer 21 except a flexible domain F is performed.

Figure 5:
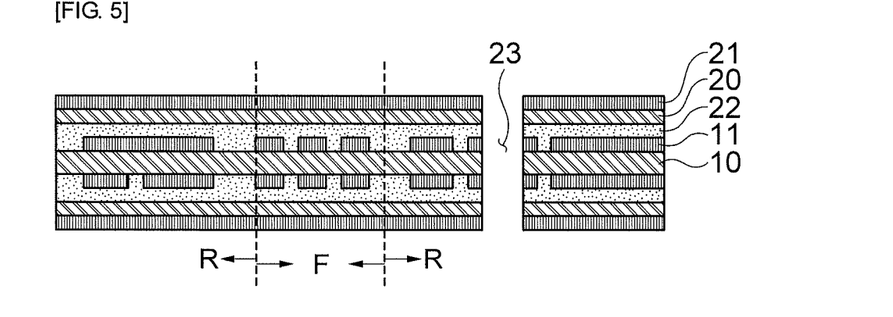

Meanwhile, as shown in FIG. 5, a through-hole 23, which penetrates the first flexible film 10 and the second flexible film 20, is processed in a rigid domain R. For example, the through-hole 23 may be processed by a computer numerical control (CNC) drill and so on.

Figure 6:
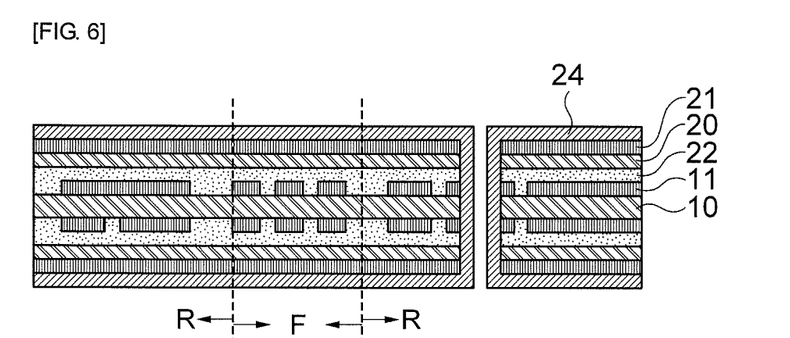

And, as shown in FIG. 6, a plating layer 24 is formed on the second metal layer 21 including an inner wall of the through-hole 23. The plating layer 24 may be formed by one or a combination of electroless plating, electroplating, screen printing, sputtering, evaporation, ink-jetting, and dispensing using one of Cu, Ag, Sn, Au, Ni, and Pd.

Figure 7:
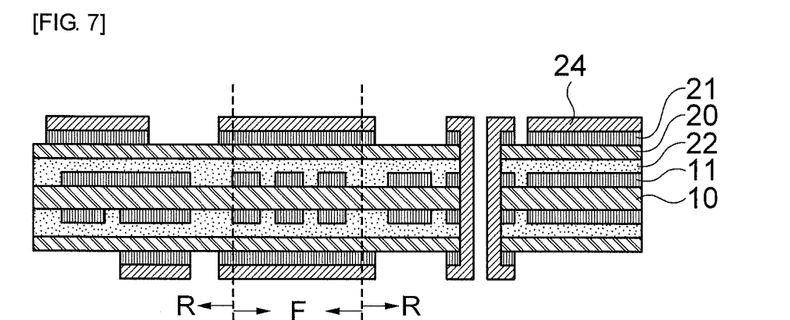

Like this, when the plating layer 24 is formed on the second metal layer 21 including the inner wall of the through-hole 23, as shown in FIG. 7, the step of forming a circuit pattern by patterning the plating layer 24 in the rigid domain R except the flexible domain F is performed.

The circuit pattern may be implemented by one of photolithography, E-beam lithography, focused ion beam lithography, dry etching, wet etching, and nano-imprinting.

Here, a point that specially needs attention is that the plating layer 24 in the flexible domain F is not patterned. This is to irradiate laser light only to a circuit layer 30 of FIG. 9 positioned directly on the second flexible film 20 in the flexible domain F in the subsequent step of removing the circuit layer 30 in the flexible domain F. That is, the second metal layer 21 in the flexible domain F, which is not patterned, functions as a laser stopper.

Figure 8:
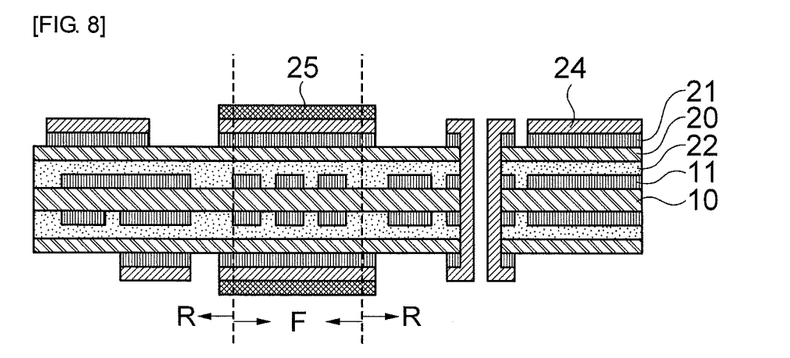

Next, as shown in FIG. 8, the step of providing an anti-oxidation protective layer 25 on the second metal layer 21 in the flexible domain F is performed.

In general, when laminating a plurality of circuit layers, oxidation (for example, brown or black oxidation) is performed on a surface of the circuit layer, that is, a surface of a metal layer on which a circuit pattern is formed, for improvement of interlayer adhesion. However, according to the method of manufacturing a rigid-flexible printed circuit board in accordance with the present invention, the anti-oxidation protective layer 25 is provided so that a surface of the second metal layer 21 in the flexible domain F is not oxidized. Accordingly, the second metal layer 21 in the flexible domain F is not discolored by an oxidation solution. The second metal layer 21 in the flexible domain F, which is not discolored, prevents laser light from being irradiated to the second flexible film 20 in the flexible domain F by reflecting the laser light in the subsequent step of removing the circuit layer 30 in the flexible domain F (that is, functioning as a laser stopper).

This anti-oxidation protective layer 25 may be made of an adhesive material including polyimide.

More specifically, the anti-oxidation protective layer 25 may be formed through the steps of applying slurry, which is made of an adhesive material including polyimide, on the second metal layer 21 corresponding to the flexible domain F and curing the slurry.

Meanwhile, in order to fix the second metal layer 21 and the anti-oxidation protective layer 25, the step of attaching a bonding sheet (not shown) between the second metal layer 21 and the anti-oxidation protective layer 25 may be additionally performed. The bonding sheet may be made of an epoxy thermosetting resin or a prepreg material.

Figure 9:
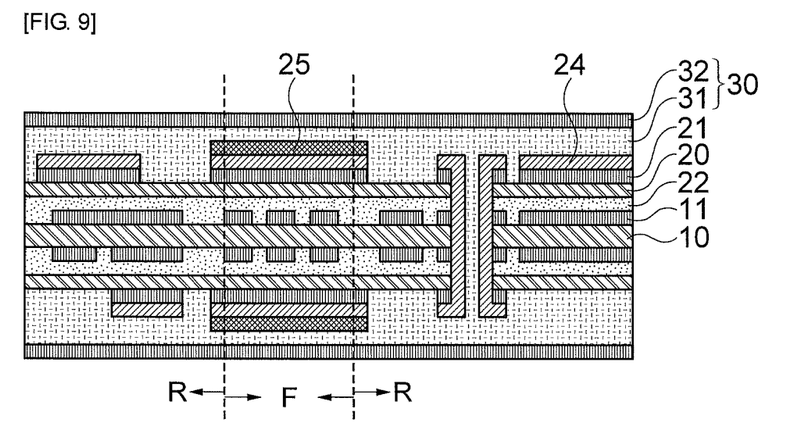

Next, as shown in FIG. 9, the step of laminating at least one circuit layer 30 on the second flexible film is performed. At this time, the surface of the second metal layer (specifically, the plating layer 24 plated on the second metal layer) is oxidized to increase interlayer adhesion. At this time, the surface of the second metal layer in the flexible domain F is not oxidized by the anti-oxidization protective layer 25.

The circuit layer 30 is a layer including a circuit pattern and may be formed through the steps of forming an insulating layer 31 which covers the circuit pattern under the circuit layer 30 (that is, the circuit pattern formed on the second metal layer 21), forming a metal layer 32 on the insulating layer 31, and forming a circuit pattern by patterning the metal layer 32.

Figure 10:
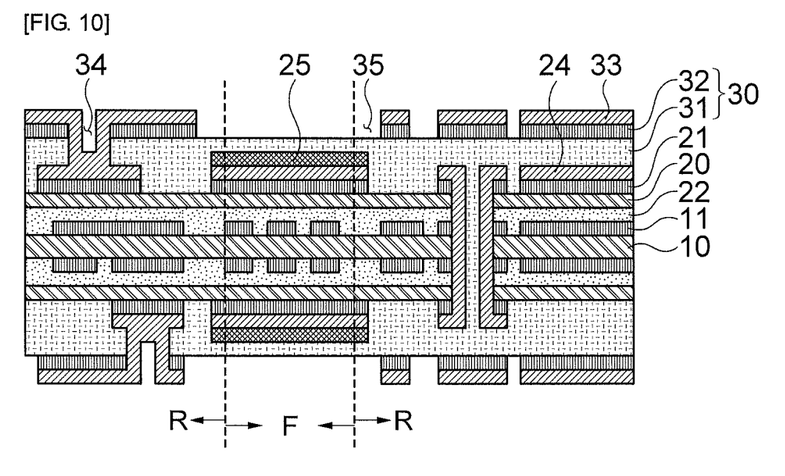

A process of forming the circuit pattern in the circuit layer 30 is similar to the step of forming the circuit pattern by patterning the second metal layer 21. That is, as shown in FIG. 10, the circuit pattern is formed by processing a via-hole 34 in the rigid domain R, forming a plating layer 33 on the metal layer 32 including an inner wall of the via-hole 34, and patterning the plating layer 33.

At this time, the metal layer in the flexible domain F is removed as well. This is to irradiate laser light to the circuit layer 30 positioned directly on the second flexible film 20 in the subsequent step of removing the circuit layer 30 in the flexible domain F.

For this, a window 35, which exposes the insulating layer 31 in the flexible domain F, is formed by applying resist on a surface of the plating layer 33 in the flexible domain F and sequentially performing exposure, developing, etching, and resist stripping processes.

Figure 11:
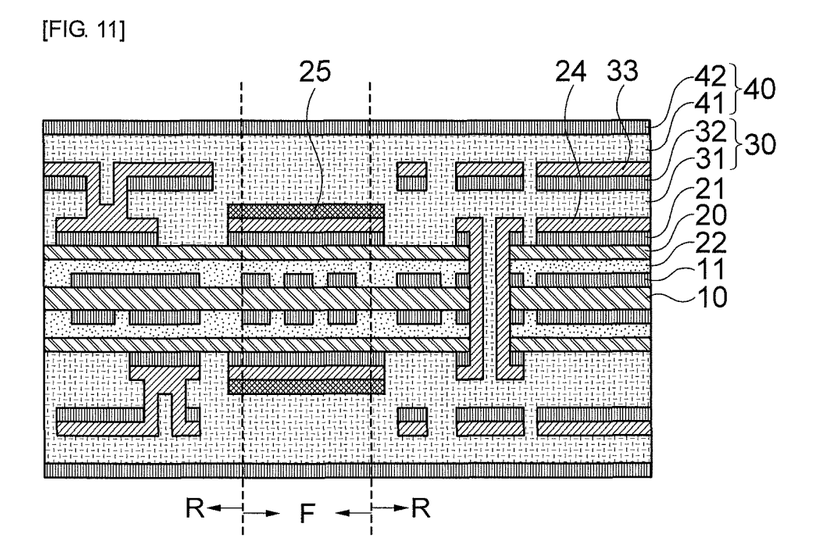

This circuit layer 30, as shown in FIG. 11, may be formed in a plurality of layers 30 and 40. At this time, in order to improve interlayer adhesion, it is preferred to laminate the circuit layer after oxidizing the circuit pattern under the upper circuit layer.

Figure 12:
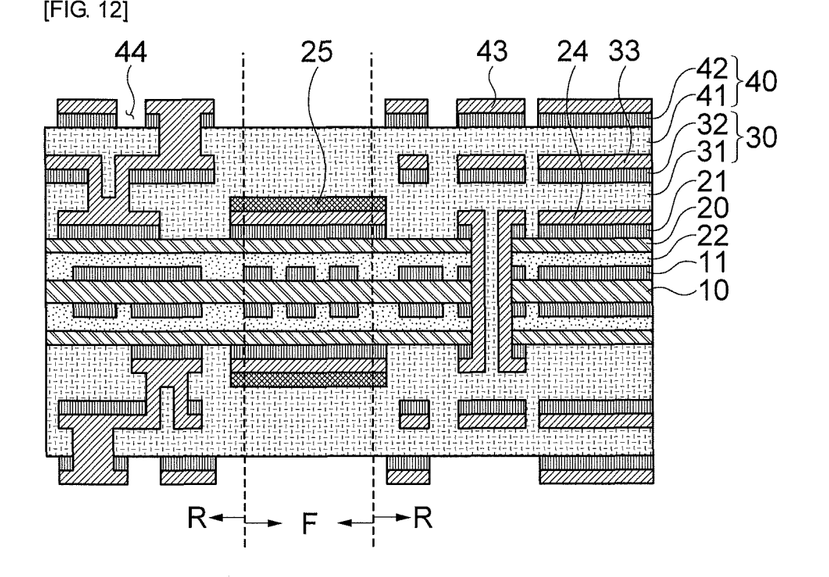

As shown in FIG. 12, the circuit pattern is formed by patterning the plating layer included in each circuit layer even when forming a plurality of circuit layers 30. That is, the circuit pattern is formed by processing a via-hole 44 in the rigid domain R, forming a plating layer 43 on the metal layer 42 including the via-hole 44, and patterning the plating layer 43.

Figure 13:
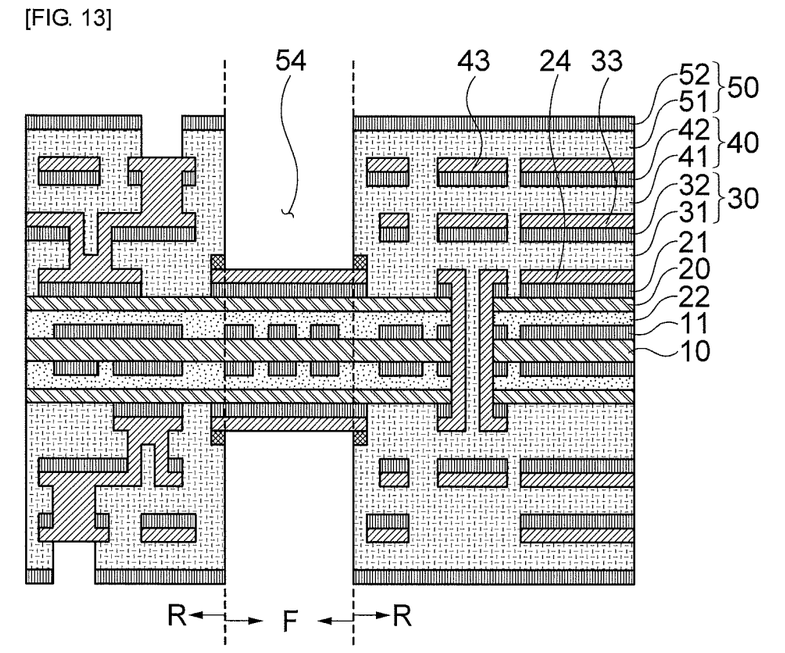

Like this, in a state in which the at least one circuit layer is formed, as shown in FIG. 13, a rigid-flexible printed circuit board manufactured by the method of manufacturing a rigid-flexible printed circuit board of the present invention is completed by performing the step of removing a portion of the circuit layer 30, 40, and 50, which corresponds to the flexible domain F.

When specifically looking into the step of removing the portion of the circuit layer 30, 40, and 50, which corresponds to the flexible domain F, first, as shown in FIG. 13, a cavity 54 is processed in the flexible domain F at the same time when forming a via-hole in the uppermost circuit layer 50.

The cavity 54 may be processed by a CO2 laser drilling process or a YAG laser drilling process, and it is preferred to remove a metal layer 52 of the uppermost circuit layer 50 before the laser drilling process. That is, a window, which exposes an insulating layer in the flexible domain F, is formed by applying resist on a surface of the metal layer 52 and sequentially performing exposure, developing, etching, and resist stripping processes.

When processing the cavity 54, the anti-oxidation protective layer 25 is removed as well. As described above, since the anti-oxidation protective layer 25 is made of an adhesive material including polyimide, it can be removed by being irradiated together with the circuit layer in the flexible domain F by the CO2 laser drilling process or the YAG laser drilling process.

Figure 14:
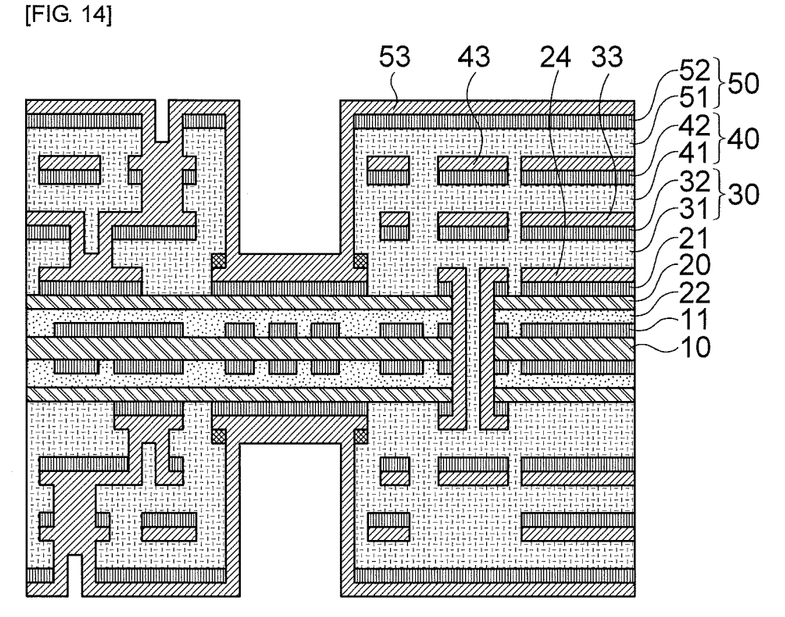

When the cavity 54 is processed, as shown in FIG. 14, a plating layer 53 is formed on the metal layer 52 including the via-hole formed in the uppermost circuit layer 50 and an inner wall of the cavity 54.

Figure 15:
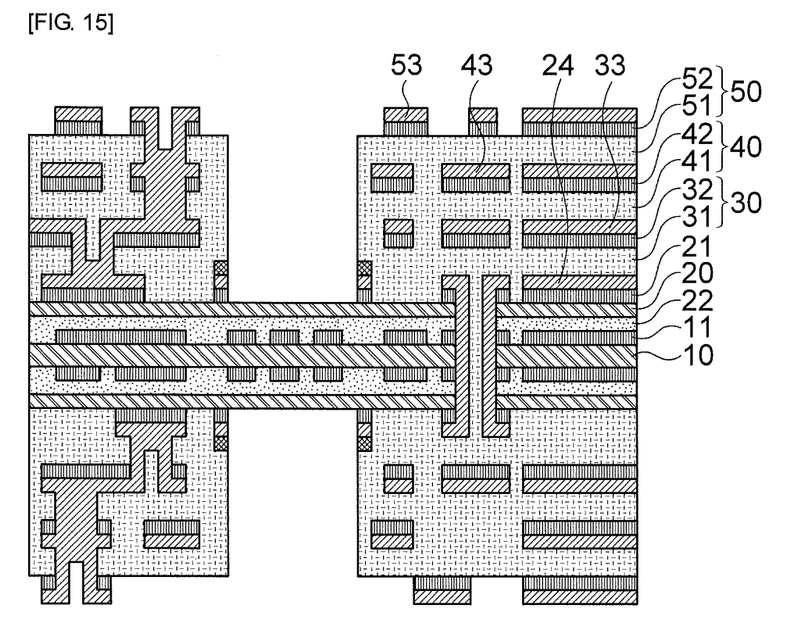

And, as shown in FIG. 15, a finished rigid-flexible printed circuit board is manufactured by removing the second metal layer 21 and the plating layer 24 in the flexible domain F at the same time when forming a circuit pattern on the plating layer 53 of the uppermost circuit layer 50.

Like this, according to the method of manufacturing a rigid-flexible printed circuit board, it is possible to prevent discoloration of the metal layer due to the oxidation process by including the step of providing the anti-oxidation protective layer 25. Accordingly, it is possible to improve reliability of products by preventing damage to the flexible film when removing the circuit layer in the flexible domain F.

Now, a method of manufacturing a rigid-flexible printed circuit board in accordance with another embodiment of the present invention will be described. Hereinafter, description of processes similar to those of the above-described method of manufacturing a rigid-flexible printed circuit board will be omitted to avoid repeated description.

FIGS. 16 through 24 are process diagrams showing a method of manufacturing a rigid-flexible printed circuit board in accordance with another embodiment of the present invention.

Figure 16:
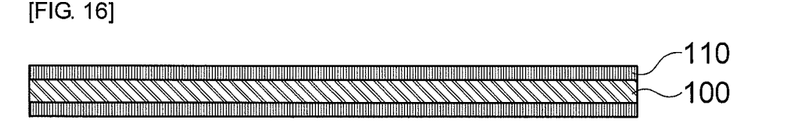
FIGS. 16 through 24 are process diagrams showing a method of manufacturing a rigid-flexible printed circuit board in accordance with another embodiment of the present invention.

First, a method of manufacturing a rigid-flexible printed circuit board in accordance with another embodiment of the present invention, as shown in FIG. 16, performs the step of providing a flexible film 100 having a metal layer 110 on one or both surfaces.

Figure 17:
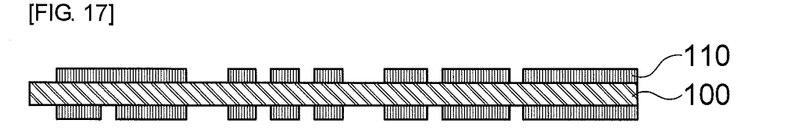

Next, as shown in FIG. 17, the step of forming a circuit pattern by patterning the metal layer 110 is performed.

Figure 18:
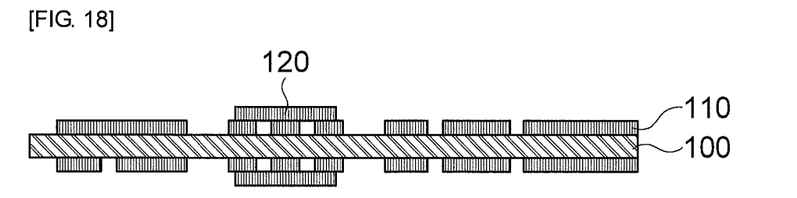

Next, as shown in FIG. 18, the step of forming a stopper metal layer 120 on the metal layer 110 in a flexible domain F.

The stopper metal layer 120 allows laser light to be irradiated only to a circuit layer positioned directly on the metal layer 110 in the subsequent step of removing the circuit layer in the flexible domain F. That is, the stopper metal layer 120 functions as a stopper during a laser process.

At this time, the step of providing a release film (not shown) between the metal layer 110 and the stopper metal layer 120 may be additionally performed. The release film, which is made of a resin and so on, is a film which is easily peeled off when some shear is applied after inserting, for example, a sharp blade, between materials in contact with the release film and commonly used in the art to which the present invention belongs.

Figure 19:
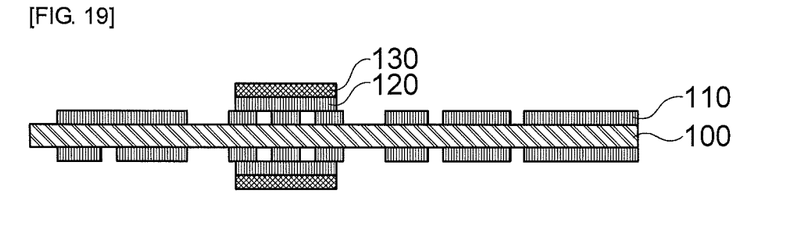

Next, as shown in FIG. 19, the step of providing an anti-oxidation protective layer 130 on the stopper metal layer 120 is performed.

In general, when laminating a plurality of circuit layers, oxidation (for example, brown or black oxidation) is performed on a surface of the circuit layer, that is, a surface of a metal layer on which a circuit pattern is formed, for improvement of interlayer adhesion. However, according to the method of manufacturing a rigid-flexible printed circuit board in accordance with another embodiment of the present invention, the anti-oxidation protective layer 130 is provided so that the metal layer 110 in the flexible domain F is not oxidized. Accordingly, a surface of the metal layer 110 in the flexible domain F is not discolored by an oxidation solution and protects the flexible film 100 by reflecting laser light in the subsequent step of removing the circuit layer in the flexible domain F (that is, functioning as a laser stopper) to prevent the laser light from being irradiated to the metal layer 110 in the flexible domain F.

At this time, in order to fix the stopper metal layer 120 and the anti-oxidation protective layer 130, the step of attaching a bonding sheet (not shown) between the stopper metal layer 120 and the anti-oxidation protective layer 130 may be additionally performed.

Figure 20:
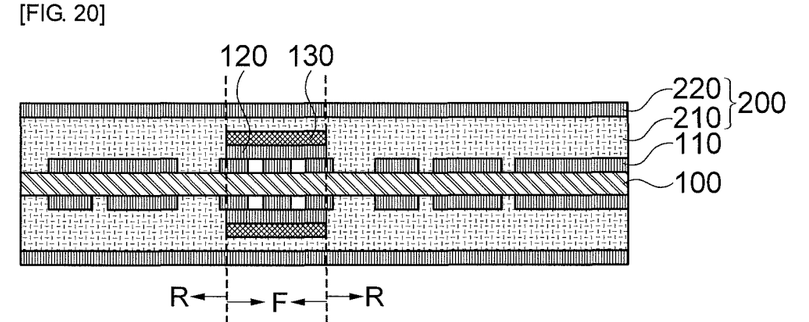

Next, as shown in FIG. 20, the step of laminating at least one circuit layer 200 on the flexible film is performed.

Figure 21:
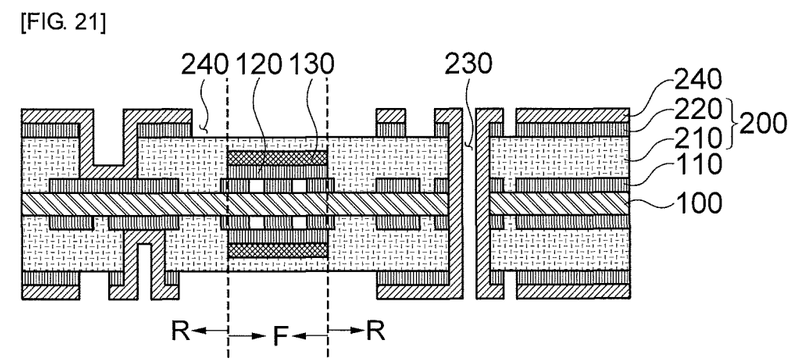

The circuit layer 200 is a layer including a circuit pattern and, as shown in FIG. 21, may be formed through the steps of forming an insulating layer 210 which covers a circuit pattern under the circuit layer 200, forming a metal layer 220 on the insulating layer 210, and forming a circuit pattern by patterning the metal layer 220.

At this time, a through-hole 230 or a via-hole may be formed simultaneously with the circuit pattern, and in the subsequent step of removing the circuit layer in the flexible domain F, in order to irradiate laser light to the circuit layer positioned directly on the flexible film 100, a window 240 is formed to expose the insulating layer 210 in the flexible domain F.

Figure 22:
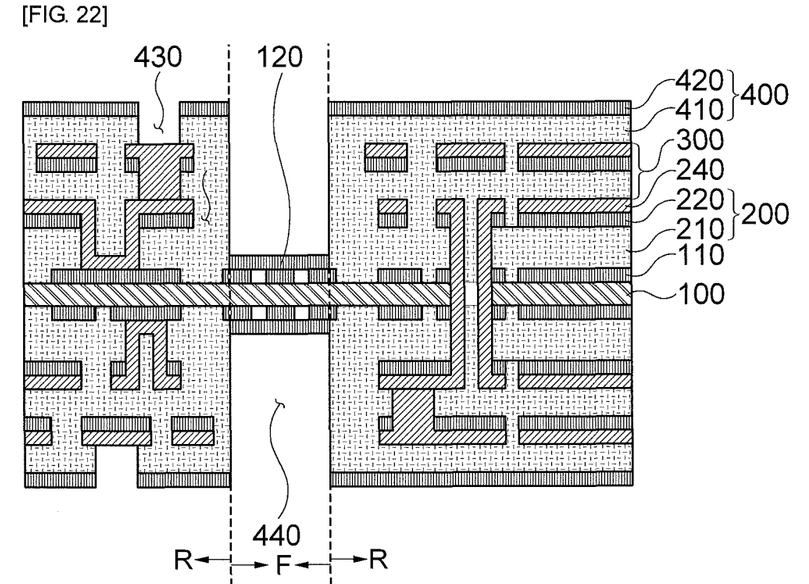

When this circuit layer 200 is formed in a plurality of layers 200, 300, and 400 as shown in FIG. 22, it is possible to manufacture a finished rigid-flexible printed circuit board by performing the step of removing the circuit layer in the flexible domain F.

The step of removing the circuit layer in the flexible domain F may be performed by a CO2 laser drilling process or a YAG laser drilling process, and at this time, the anti-oxidation protective film 130 is also irradiated and removed by laser light.

Figure 23:
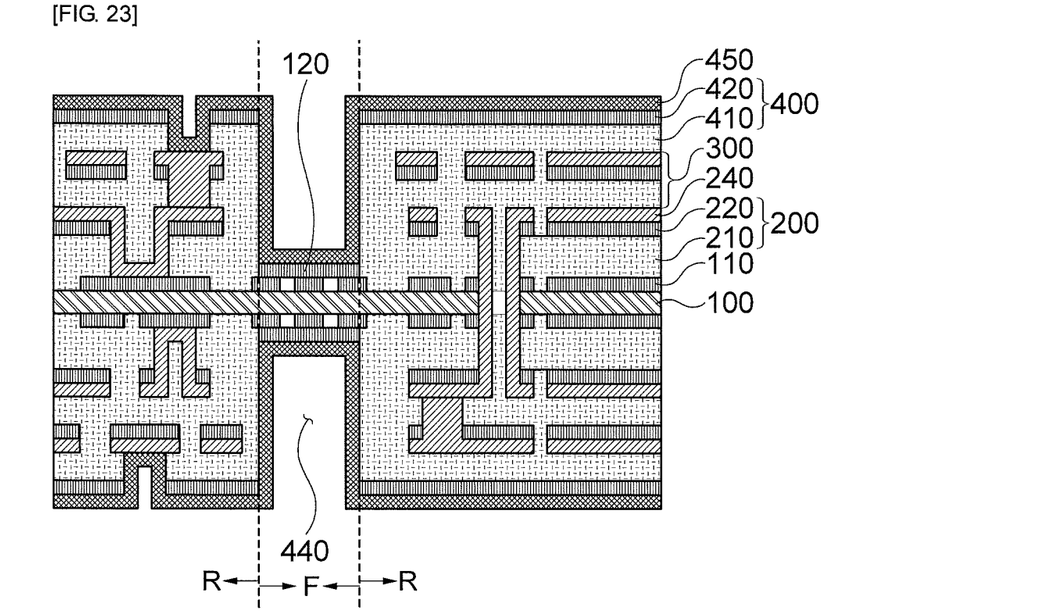
Figure 24:
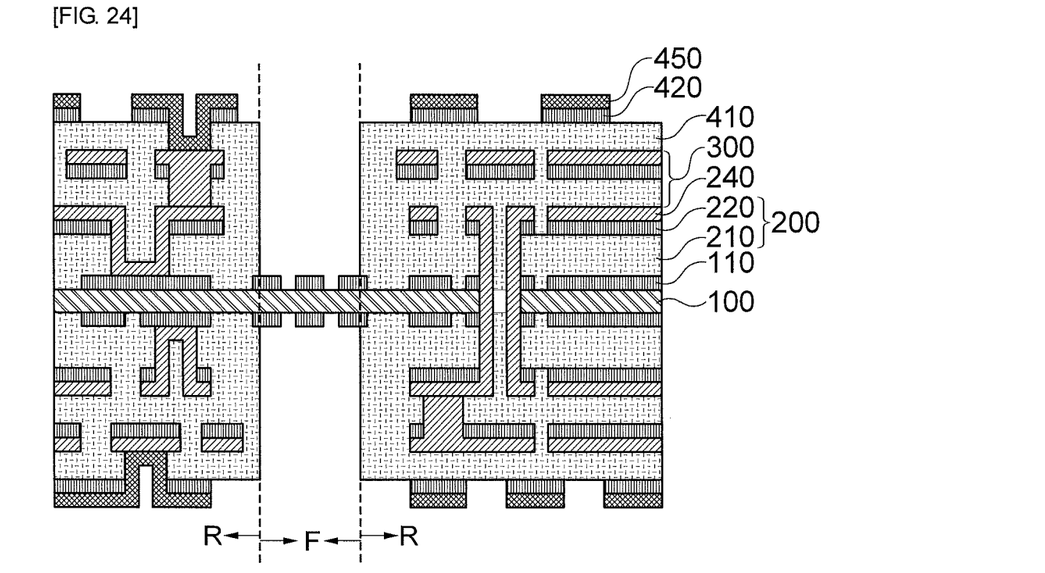

When specifically looking into the step of removing the circuit layer in the flexible domain F, first, as shown in FIG. 22, a cavity 440 is processed in the flexible domain F by a CO2 laser drilling process or a YAG laser drilling process. Next, as shown in FIG. 23, a plating layer 450 is plated on the uppermost circuit layer 400, and as shown in FIG. 24, the stopper metal layer 120 is also removed when forming a circuit pattern on the uppermost circuit layer 400. This stopper metal layer 120 can be removed by separating the release film provided between the stopper metal layer 120 and the metal layer 110.

According to the method of manufacturing a rigid-flexible printed circuit board, it is possible to prevent discoloration of the metal layer due to the oxidation process by including the step of providing the anti-oxidation protective layer. Accordingly, it is possible to improve reliability of products by preventing damage to the flexible film in the step of removing the circuit layer in the flexible domain F.

The foregoing description illustrates the present invention. Additionally, the foregoing description shows and explains only the preferred embodiments of the present invention, but it is to be understood that the present invention is capable of use in various other combinations, modifications, and environments and is capable of changes and modifications within the scope of the inventive concept as expressed herein, commensurate with the above teachings and/or the skill or knowledge of the related art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A multilayer rigid flexible printed circuit board having a rigid portion and a flexible portion, the multilayer rigid flexible printed circuit board comprising:
   a flexible core layer comprising a first flexible film including a first circuit pattern on one or both surfaces and having an area corresponding to an area of the multilayer rigid flexible printed circuit board, and a second flexible film disposed on the first flexible film and including a second circuit pattern disposed on the rigid portion of the second flexible film;
   a pattern stack disposed on a portion of the rigid portion of the second flexible film to be adjacent to the flexible portion, and having a metal pattern disposed on the rigid portion of the second flexible film and a protective pattern disposed on the metal pattern;
   an insulating layer disposed on the rigid portion of the second flexible film, covering the metal pattern and the protective layer thereon; and
   a third circuit pattern disposed on the insulating layer.

2. The multilayer rigid flexible printed circuit board according to claim 1, wherein the metal pattern is exposed on a side surface of the rigid portion facing the flexible portion.

3. The multilayer rigid flexible printed circuit board according to claim 1, wherein the multilayer rigid flexible printed circuit board has a thickness of the rigid portion being greater than that of the flexible portion thereof.

4. The multilayer rigid flexible printed circuit board according to claim 1, further comprising a bonding sheet between the first flexible film and the second flexible film.

5. The multilayer rigid flexible printed circuit board according to claim 1, further comprising a bonding sheet between the second flexible film and the protective layer.

6. The multilayer rigid flexible printed circuit board according to claim 5, wherein the bonding sheet includes at least one of an epoxy thermosetting resin and a prepreg material.

7. The multilayer rigid flexible printed circuit board according to claim 1, wherein the protective layer comprises an adhesive material including polyimide.

8. The multilayer rigid flexible printed circuit board according to claim 1, wherein the second flexible film is disposed on an entire area of the first flexible film.

9. The multilayer rigid flexible printed circuit board according to claim 1, wherein the metal pattern comprises a metal layer on the second flexible film and a plating layer on the metal layer.

10. The multilayer rigid flexible printed circuit board according to claim 1, wherein the metal pattern makes contact with the insulating layer.

11. The multilayer rigid flexible printed circuit board according to claim 1, wherein the metal pattern is physically isolated from the second circuit pattern.

12. A multilayer rigid flexible printed circuit board having a rigid portion and a flexible portion, the multilayer rigid flexible printed circuit board comprising:
   a first flexible film including a first circuit pattern on one or both surfaces and having an area corresponding to an area of the multilayer rigid flexible printed circuit board;
   a pattern stack disposed on a portion of the rigid portion of the first flexible film to be adjacent to the flexible portion, and having a metal pattern disposed on the rigid portion of the first flexible film and a protective pattern disposed on the metal pattern;
   an insulating layer disposed on the rigid portion of the first flexible film, covering the metal pattern having the protective layer thereon and having an additional circuit pattern.

13. The multilayer rigid flexible printed circuit board according to claim 12, wherein the metal pattern is physically isolated from the second circuit pattern.

* * * * *

UNITED STATES PATENT AND TRADEMARK OFFICE
CERTIFICATE OF CORRECTION

PATENT NO. : 9,955,580 B2
APPLICATION NO. : 15/228304
DATED : April 24, 2018
INVENTOR(S) : Yang Je Lee et al.

It is certified that error appears in the above-identified patent and that said Letters Patent is hereby corrected as shown below:

In the Claims

In Claim 1, Column 9, Lines 52-57 and Column 10, Lines 1-3 should read -- the second flexible film of the rigid portion;
a pattern stack disposed on a portion of the second flexible film of the rigid portion to be adjacent to the flexible portion, and having a metal pattern disposed on the second flexible film of the rigid portion and a protective pattern disposed on the metal pattern;
an insulating layer disposed on the second flexible film of the rigid portion, covering the metal pattern and the protective pattern thereon; and --

In Claim 5, Column 10, Line 18 should read -- between the second flexible film and the protective pattern. --

In Claim 7, Column 10, Line 24 should read -- according to claim 1, wherein the protective pattern comprises --

In Claim 12, Column 10, Lines 46-54 should read -- a pattern stack disposed on a portion of the first flexible film of the rigid portion to be adjacent to the flexible portion, and having a metal pattern disposed on the first flexible film of the rigid portion and a protective pattern disposed on the metal pattern;
an insulating layer disposed on the first flexible film of the rigid portion, covering the metal pattern having the protective pattern thereon and having an additional circuit pattern. --

Signed and Sealed this
Twentieth Day of November, 2018

Andrei Iancu
*Director of the United States Patent and Trademark Office*